(12) United States Patent
Nie

(10) Patent No.: US 11,916,081 B2
(45) Date of Patent: Feb. 27, 2024

(54) DISPLAY PANEL

(71) Applicant: WUHAN CHINA STAR OPTOELECTRONICS TECHNOLOGY CO., LTD, Wuhan (CN)

(72) Inventor: Xiaohui Nie, Wuhan (CN)

( * ) Notice: Subject to any disclaimer, the term of this patent is extended or adjusted under 35 U.S.C. 154(b) by 863 days.

(21) Appl. No.: 16/970,363

(22) PCT Filed: Jun. 18, 2020

(86) PCT No.: PCT/CN2020/096715
§ 371 (c)(1),
(2) Date: Aug. 16, 2020

(87) PCT Pub. No.: WO2021/223292
PCT Pub. Date: Nov. 11, 2021

(65) Prior Publication Data
US 2023/0088504 A1    Mar. 23, 2023

(30) Foreign Application Priority Data
May 7, 2020    (CN) .......................... 202010378815.9

(51) Int. Cl.
*H01L 27/12*     (2006.01)
*G06F 3/041*     (2006.01)

(52) U.S. Cl.
CPC .......... *H01L 27/124* (2013.01); *G06F 3/0412* (2013.01); *G06F 3/04164* (2019.05)

(58) Field of Classification Search
CPC . H01L 27/124; G06F 3/0412; G06F 3/04164; G02F 1/13338; G02F 1/136227

USPC .......................................................... 257/72
See application file for complete search history.

(56) References Cited

U.S. PATENT DOCUMENTS

| | | | |
|---|---|---|---|
| 2015/0264805 A1 | 9/2015 | Chen | |
| 2018/0329544 A1* | 11/2018 | Yeh | G06F 3/04164 |
| 2019/0333938 A1* | 10/2019 | Wang | G06F 3/04164 |
| 2020/0058710 A1 | 2/2020 | Li | |
| 2020/0103991 A1* | 4/2020 | Nie | G02F 1/13338 |
| 2020/0280005 A1* | 9/2020 | Fang | G09F 9/30 |
| 2021/0041733 A1* | 2/2021 | Ai | G02F 1/136209 |

FOREIGN PATENT DOCUMENTS

| | | |
|---|---|---|
| CN | 106371666 A | 2/2017 |
| CN | 106569355 A | 4/2017 |
| CN | 107611160 A | 1/2018 |
| CN | 108511465 A | 9/2018 |
| CN | 108572757 A | 9/2018 |
| CN | 108682303 A | 10/2018 |
| CN | 108986672 A | 12/2018 |

(Continued)

*Primary Examiner* — Tong-Ho Kim

(57) ABSTRACT

The present invention provides a display panel, including a substrate, a dielectric layer, and a sensing electrode layer. Touch control traces are disposed in the dielectric layer. In the present invention, protrusions are disposed on left and right sides of a first linear part of the touch control traces. When the touch control traces are subjected to shear stress, diagonal directions of the protrusions on the left and right sides compensate for a deformation of the panel and buffer the stress on the touch control traces, reducing the stress on the touch control traces and preventing trace breakage.

9 Claims, 3 Drawing Sheets

(56) References Cited

FOREIGN PATENT DOCUMENTS

| | | | |
|---|---|---|---|
| CN | 109003960 | A | 12/2018 |
| CN | 109062442 | A | 12/2018 |
| CN | 208335161 | U | 1/2019 |
| CN | 109683413 | A | 4/2019 |
| CN | 109817097 | A | 5/2019 |
| CN | 110265459 | A | 9/2019 |

\* cited by examiner

DISPLAY PANEL

FIELD OF INVENTION

The invention relates to the field of display technology, in particular to a display panel.

BACKGROUND OF INVENTION

In order to achieve an integration of liquid crystal display and touch control function, in a field of small and medium-sized displays, a common electrode is generally patterned to serve as both the common electrode of the liquid crystal display and a sensing electrode of the touch control function, and display and touch control functions are simultaneously driven through a time-sharing operation. Based on an embedded degree of sensing electrode in the liquid crystal display (LCD) panel, it is classified into on-cell touch control technology and in-cell touch control technology. Among them, the in-cell touch control technology completely embeds the touch control function in liquid crystal pixels, so it has outstanding advantages, such as thin body, excellent display effect, and good light transmittance, and has become a top choice for high-end market. Specifically, the in-cell touch control technology is classified into mutual capacitive touch control technology and self-capacitive touch control technology based on their working principles. Self-capacitive in-cell touch control technology divides the sensing electrodes into sensor pads arranged like a checkerboard through a patterning method. Each sensing pad individually leads out by providing one or more touch control metal leads (TP_trace), to form a touch control channel. The TP_trace gathers at an integrated circuit (IC) on a bottom of a display panel to form a fan-out area (TP_fanout), which is sequentially connected to the IC to realize multi-touch control. Therefore, an integrity of the TP_trace determines whether the touch control function can be fully realized.

Technical Problem

In an actual manufacturing process of a thin film transistor array substrate, since the TP_trace is formed on a non-metallic film layer by physical vapor deposition process, large stress exists between the TP_trace and the non-metallic film layer. This causes the TP_trace of a linear part in the fan-out area (TP_fanout) to be prone to breakage when dropped or subjected to other external forces during actual use of the display panel, resulting in poor touch control function.

SUMMARY OF INVENTION

The purpose of the present invention is to provide a display panel to solve the problem that the touch control metal lead of the linear part in the fan-out area is prone to breakage due to the display panel being dropped or subjected to other external forces in practical application.

To solve the above problems, a display panel is provided, includes: a substrate; a dielectric layer disposed on the substrate; a sensing electrode layer disposed on the dielectric layer; wherein touch control traces are disposed in the dielectric layer, and each of the touch control traces is connected to the sensing electrode layer; and in a fan-out area of the substrate, each of the touch control traces includes a first linear part, adjacent first linear parts are parallel to each other, and a left side and a right side of the first linear part are provided with protrusions.

Further, the protrusions include left-side protrusions and right-side protrusions, which are evenly distributed on the left side and the right side of the first linear part, and the left-side protrusions and the right-side protrusions positioned between the adjacent first linear parts are alternately distributed.

Further, each of the touch control traces further includes a second linear part and a connecting part; a plurality of second linear parts are disposed in a display area of the substrate, and adjacent second linear parts are parallel to each other, and the connecting part is connected to the first linear part and the second linear part.

Further, a distance between the adjacent second linear parts is greater than a distance between the adjacent first linear parts.

Further, in each of the touch control traces, the first linear part and the second linear part are parallel to each other, a distance from the first linear part to a center line of the display panel is less than a distance from the second linear part to the center line of the display panel.

Further, lengths of the second linear parts increase from the center line of the display panel to left and right sides of the display panel; and lengths of the first linear parts decrease from the center line of the display panel to the left and right sides of the display panel.

Further, the dielectric layer is provided with a via-hole, the via-hole extends downward to a surface of the touch control trace, and the sensing electrode layer is connected to the touch control trace through the via-hole.

Further, the dielectric layer includes: a buffer layer, and a light-shielding layer disposed in the buffer layer; a gate insulating layer disposed on the buffer layer, and an active layer disposed in the gate insulating layer; an interlayer insulating layer disposed on the gate insulating layer, and a first metal layer disposed in the interlayer insulating layer; and a planarization layer disposed on the interlayer insulating layer, and a second metal layer disposed in the planarization layer.

Further, the touch control trace is formed in the first metal layer or the second metal layer.

Further, the display panel includes a passivation layer disposed on the sensing electrode layer; and a pixel electrode disposed on the passivation layer and connected to the second metal layer.

BENEFICIAL EFFECT

The present invention provides a display panel, wherein protrusion structures are disposed on the left and right sides of the first linear part of the touch control trace. When the touch control trace is subjected to shear stress, diagonal directions of the protrusions on the left and right sides compensate for the deformation of the panel and buffer the stress on the touch control trace, reducing the stress on the touch control trace and preventing trace breakage.

DESCRIPTION OF DRAWINGS

In order to more clearly explain the technical solutions in the embodiments of the present invention, the drawings in the description of the embodiments will be briefly introduced below. Obviously, the drawings in the following description are only some embodiments of the present invention. For those skilled in the art, other drawings can be obtained based on these drawings, without doing any creative work.

Figure 1:
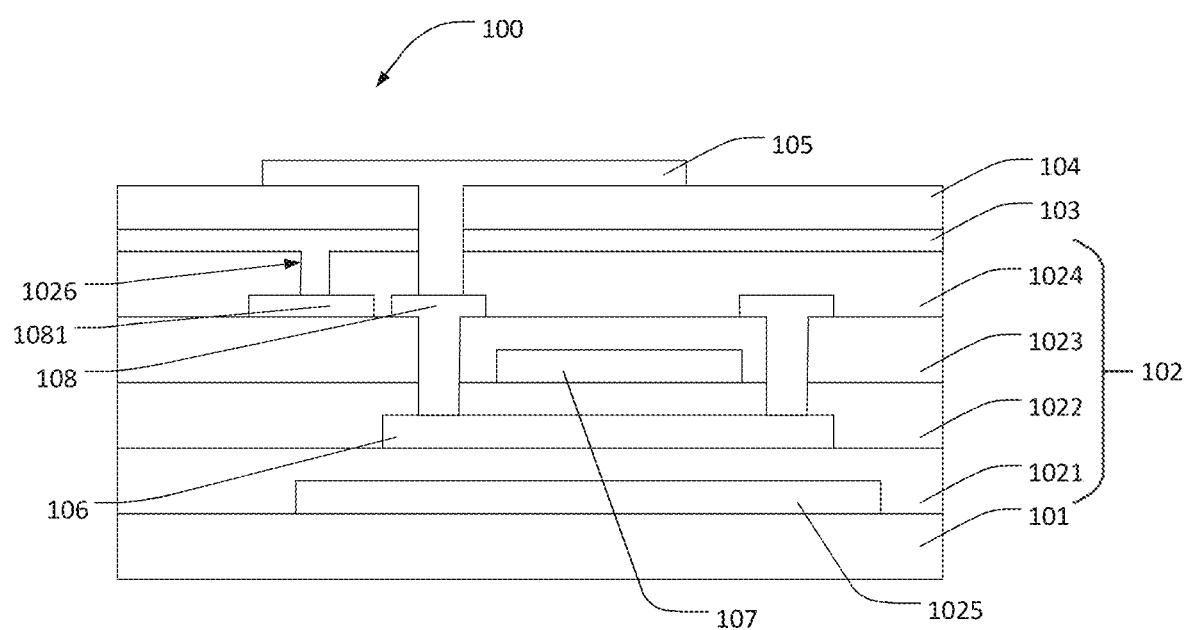
FIG. 1 is a schematic structural diagram of a display panel provided by the present invention.

REFERENCE NUMERALS display panel 100, substrate 101, dielectric layer 102, sensing electrode layer 103, passivation layer 104, pixel electrode 105, buffer layer 1021, gate insulating layer 1022, interlayer insulating layer 1023, planarization layer 1024, light-shielding layer 1025, first metal layer 107, second metal layer 108, active layer 106, touch control trace 1081, via-hole 1026, first linear part 1081-1, second linear part 1081-3, connecting part 1081-2, protrusion 109, fan-out area 110.

DETAILED DESCRIPTION OF PREFERRED EMBODIMENTS

The following descriptions of the embodiments reference with the drawings to illustrate specific embodiments that the present invention can be implemented. Directional terms mentioned in the present invention, such as above, below, front, back, left, right, inside, outside, side, etc., are only directions referring to the drawings. The designations of elements mentioned in the present invention, such as first and second, are only to distinguish different parts and can be better expressed. In the drawings, units with similar structures are denoted by the same reference numerals.

Embodiments of the present invention will be described in detail with reference to the drawings. The present invention can be embodied in various forms, and the present invention should not be interpreted merely as the specific embodiments set forth herein. The embodiments of the present invention are provided to explain the actual application of the present invention, so that those skilled in the art can understand various embodiments of the present invention and various modifications suitable for specific intended applications.

Figure 2:
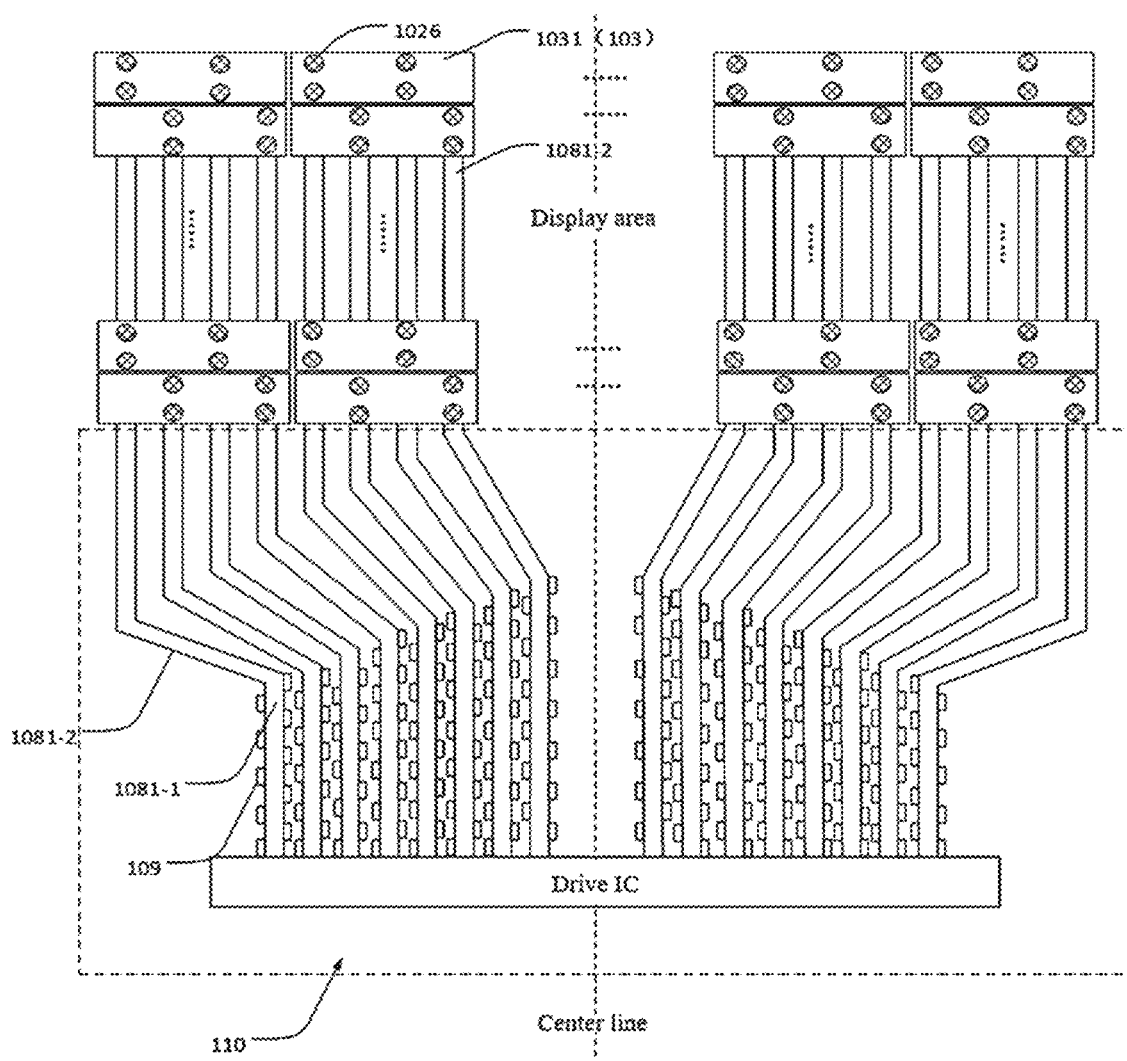
FIG. 2 is a schematic plan view of a touch control trace and a sensing electrode layer provided by the present invention.

As shown in FIG. 1 and FIG. 2, the present invention provides a display panel 100 including: a substrate 101, a dielectric layer 102, and a sensing electrode layer 103.

A material of the substrate 101 is polyimide (PI), which is used to achieve flexible bending.

The dielectric layer 102 is disposed on the substrate 101.

The dielectric layer 102 includes a buffer layer 1021, a gate insulating layer 1022, an interlayer insulating layer 1023, and a planarization layer 1024.

A light shielding layer 1025 is disposed in the buffer layer 1021.

The gate insulating layer 1022 is disposed on the buffer layer 1021, and an active layer 106 is disposed in the gate insulating layer 1022.

The interlayer insulating layer 1023 is disposed on the gate insulating layer 1022, and a first metal layer 107 is disposed in the interlayer insulating layer 1023. The first metal layer 107 includes gate lines forming thin film transistors.

The planarization layer 1024 is disposed on the interlayer insulating layer 1023, and the planarization layer 1024 is provided with a second metal layer 108.

The sensing electrode layer 103 is disposed on the dielectric layer 102. The sensing electrode layer 103 includes a plurality of sensor pads. The sensor pads are distributed in an array.

The dielectric layer 102 is provided with a via-hole 1026, the via-hole 1026 extends downward to a surface of a touch control trace 1081, and the sensing electrode layer 103 is connected to the touch control trace 1081 through the via-hole 1026. The present invention does not limit the number of via-hole 1026.

Wherein, the dielectric layer 102 is provided with a plurality of touch control traces 1081, and each touch control trace 1081 is connected to the sensing electrode layer 103. Each touch control trace 1081 is connected to a corresponding sensor pad.

At least one touch control trace 1081 is connected to the sensor pad. The touch control trace 1081 is formed in the first metal layer 107 or the second metal layer 108. In the present invention, the touch control trace 1081 is preferably disposed in the second metal layer 108.

Each touch control trace 1081 also includes a first linear part 1081-1, a second linear part 1081-3, and a connecting part 1081-2. The panel has a center line.

The first linear part 1081-1 is provided in a fan-out area 110 of the substrate 101, and the first linear part 1081-1 is connected to a driving IC. Adjacent first linear parts 1081-1 are parallel to each other and left and right sides of the first linear parts 1081-1 have a plurality of protrusions 109.

The protrusions 109 include left-side protrusions and right-side protrusions, which are evenly distributed on the left side and the right side of the first linear part 1081-1, and the left-side protrusions and the right-side protrusions positioned between the adjacent first linear parts are alternately distributed.

Further, on two adjacent first linear parts 1081-1, a left-side protrusion of one first linear part 1081-1 corresponds to a spaced position between the right-side protrusions of the other first linear part 1081-1, thus, a staggered structure is formed. In fact, on the same first linear part 1081-1, the left-side protrusions and the right-side protrusions are also staggered, rather than symmetrically distributed.

Figure 3:
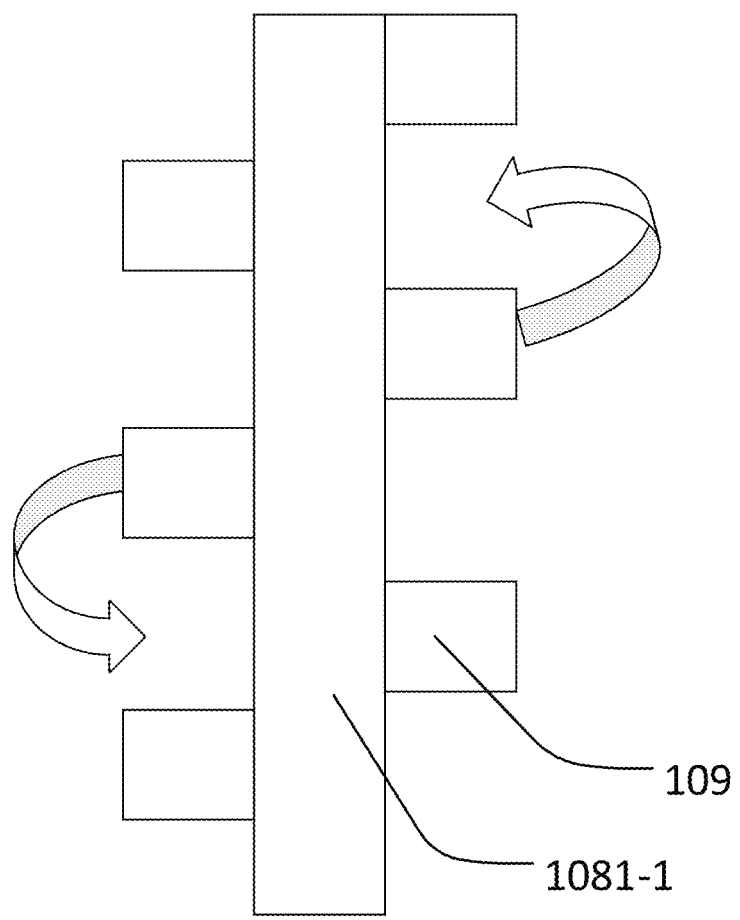
FIG. 3 is a schematic structural view of force applied to a first linear part provided by the present invention.

The structure of the first linear part 1081-1 of the present invention is shown in FIG. 3. When the touch control trace 1081 is subjected to shear stress, diagonal directions of the protrusions 109 on the left and right compensate for the deformation of the panel and buffer the stress on the touch control trace 1081 (first linear part 1081-1), reducing the stress on the touch control trace 1081 and preventing trace breakage.

In the prior art, there is no protrusion 109 on the left and right sides. When it is dropped or subjected to other external forces, shear stress exists between TP_trace and the non-metal film layer. The TP_trace has no buffer and no deformation space when it is under stress, and is prone to breakage.

The second linear part 1081-3 is disposed in the display area of the substrate 101, and adjacent second linear parts 1081-3 are parallel to each other.

The connecting part 1081-2 connects the first linear part 1081-1 and the second linear part 1081-3, and adjacent connecting parts 1081-2 are parallel to each other. The connecting part 1081-2 is symmetrical with respect to the center line.

In each touch control trace 1081, the first linear part 1081-1 and the second linear part 1081-3 are parallel to each other. A distance from the first linear part 1081-1 to the center line of the display panel 100 is less than a distance from the second linear part 1081-3 to the center line of the display panel.

Each touch control trace 1081 is tightened in the fan-out area 110 due to the function of the connecting part 1081-2, so a distance between the adjacent second linear parts 1081-3 is greater than a distance between the adjacent first linear parts 1081-1. That is, the touch control trace 1081 forms a circuitous wiring structure through the connecting part 1081-2, and then is tightened in the fan-out area 110 to realize a narrow frame structure.

Lengths of the second linear parts 1081-3 increase from the center line to left and right sides of the display panel 100; and lengths of the first linear parts 1081-1 decrease from the center line to the left and right sides of the display panel 100. In this way, a circuitous structure can be formed, and a narrow frame structure can be realized.

The display panel 100 further includes a passivation layer 104 and a pixel electrode 105.

The passivation layer 104 is disposed on the sensing electrode layer 103.

The pixel electrode 105 is disposed on the passivation layer 104 and connected to the second metal layer 108. Specifically, connected to the source/drain electrodes of the thin film transistor.

The technical scope of the present invention is not limited to the content in the description. Those skilled in the art can make various changes and modifications to the embodiments without departing from the technical idea of the present invention, and these changes and modifications fall within the scope of the present invention.

What is claimed is:

1. A display panel, comprising:
   a substrate;
   a dielectric layer disposed on the substrate; and
   a sensing electrode layer disposed on the dielectric layer;
   wherein touch control traces are disposed in the dielectric layer, and each of the touch control traces is connected to the sensing electrode layer; and
   in a fan-out area of the substrate, each of the touch control traces comprises a first linear part, adjacent first linear parts are parallel to each other, and a left side and a right side of the first linear part are provided with protrusions,
   wherein the protrusions comprise left-side protrusions and right-side protrusions evenly distributed on the left side and the right side of the first linear part, and the left-side protrusions and the right-side protrusions positioned between the adjacent first linear parts are alternately distributed.

2. The display panel according to claim 1, wherein each of the touch control traces further comprises a second linear part and a connecting part, a plurality of second linear parts are disposed in a display area of the substrate, adjacent second linear parts are parallel to each other, and the connecting part is connected to the first linear part and the second linear part.

3. The display panel according to claim 2, wherein a distance between the adjacent second linear parts is greater than a distance between the adjacent first linear parts.

4. The display panel according to claim 2, wherein in each of the touch control traces, the first linear part and the second linear part are parallel to each other, and a distance from the first linear part to a center line of the display panel is less than a distance from the second linear part to the center line of the display panel.

5. The display panel according to claim 2, wherein lengths of the second linear parts increase from a center line of the display panel to left and right sides of the display panel, and lengths of the first linear parts decrease from the center line of the display panel to the left and right sides of the display panel.

6. The display panel according to claim 1, wherein the dielectric layer is provided with a via-hole, the via-hole extends downward to a surface of the touch control traces, and the sensing electrode layer is connected to the touch control traces through the via-hole.

7. The display panel according to claim 1, wherein the dielectric layer comprises:
   a buffer layer, and a light-shielding layer disposed in the buffer layer;
   a gate insulating layer disposed on the buffer layer, and an active layer disposed in the gate insulating layer;
   an interlayer insulating layer disposed on the gate insulating layer, and a first metal layer disposed in the interlayer insulating layer; and
   a planarization layer disposed on the interlayer insulating layer, and a second metal layer disposed in the planarization layer.

8. The display panel according to claim 7, wherein the touch control traces are formed in the first metal layer or the second metal layer.

9. The display panel according to claim 7, further comprising:
   a passivation layer disposed on the sensing electrode layer; and
   a pixel electrode disposed on the passivation layer and connected to the second metal layer.

* * * * *